Jan. 17, 1967 M. E. G. KNAPP-ZILLER 3,299,293

SINUSOIDAL TO RECTANGULAR WAVE CONVERTER AND AMPLIFIER

Filed March 13, 1964 3 Sheets-Sheet 1

SINUSOIDAL TO RECTANGULAR WAVE CONVERTER AND AMPLIFIER

Filed March 13, 1964 3 Sheets-Sheet 2

Jan. 17, 1967 M. E. G. KNAPP-ZILLER 3,299,293

SINUSOIDAL TO RECTANGULAR WAVE CONVERTER AND AMPLIFIER

Filed March 13, 1964 3 Sheets-Sheet 3

United States Patent Office 3,299,293
Patented Jan. 17, 1967

3,299,293
SINUSOIDAL TO RECTANGULAR WAVE CONVERTER AND AMPLIFIER

Michel Edouard Georges Knapp-Ziller, Vaux-sur-Seine, France, assignor to Lignes Telegraphiques et Telephoniques, Paris, France Filed Mar. 13, 1964, Ser. No. 351,812
Claims priority, application France, Mar. 21, 1963, 928,739
7 Claims. (Cl. 307—88.5)

The present invention relates to a converter and amplifier by means of which a rectangular-wave signal of constant amplitude having equal positive and negative excursions can be derived from a sinusoidal wave of similar fundamental frequency, whose amplitude may be a variable one.

The converter-amplifier units thus far known, generally comprise a sine-wave amplifier the output circuit of which is coupled to a clipper unit formed, for example, by an extra secondary winding provided in an output transformer, which winding is closed on a non-linear impedance, the variation of whose value as a function of the magnitude of the applied voltage gives it its clipping properties. However, because of the power dissipated in the clipper unit, devices of this type have but a very low efficiency, since the amplifier has not only to be designed to dissipate a very high power but must operate right up to the limits of its working range. These drawbacks are overcome by the device proposed in accordance with the present invention.

The converter-amplifier which is one object of the present invention essentially comprises an input transformer, a transistor and an output transformer, means for biasing the electrodes of said transistor from a direct-current source, and a non-linear negative feedback circuit extending between the input and output circuits of said transistor. This negative feedback circuit is in the form of a two-terminal network comprising two Zener (breakdown) diode assemblies connected in series and in opposition, these diode assemblies having as near as possible matched characteristics together with a low parallel capacitance ( the higher the frequency of the wave to be transformed, the lower the capacitances of these diodes should be). A capacitance value lesser than 5 micromicrofarads is generally required at frequencies above 500 kc./s. (kilocycles per second).

Each of the diode assemblies can take the form of a single diode or of several diodes in series connection.

The wave shape of the signal appearing at the output of the device is the same as that of the signal applied to the input as long as the signal appearing across the terminals of the said two-terminal network has a lower voltage than a certain reference voltage $v$. Beyond this reference voltage, the wave shape of the output signal depends on the shape of the current-voltage characteristic curve of the Zener diodes. It results therefrom that clipping of the amplified sinusoidal wave takes place, which gives the signal received at the output of the device a more or less rectangular-wave form.

By said reference voltage shall be understood the effective signal voltage which would be measured across the terminals of the two-terminal network when this network carries a current corresponding to the normal operating condition of the system, i.e. to a condition in which the current passing through the negative feedback circuit is large enough to make clipping effective. Thanks to the well-known properties of the Zener diodes, the so-defined reference voltage is comparatively independent of the exact value of the intensity of said current.

The invention will now be described more particularly by making reference to some of its embodiments, which are in no way to be taken as limitative of its scope. The description will be given with reference to the attached drawings, in which.

Figure 1:
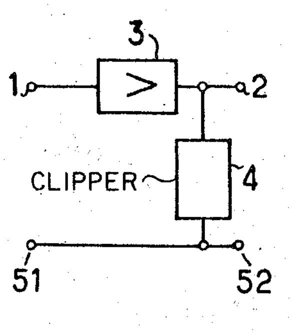
Fig.1 PRIOR ART
FIGURE 1 is a schematic illustration of a converter-amplifier of a type known in the previous art.

Referring now to FIGURE 1, the circuit diagram is illustrated of a converter-amplifier of an earliest mentioned known type. In this unit, between an input circuit 1, 51 and an output circuit 2, 52 there is inserted a linear amplifier 3 and a clipper device 4 which is shunted across the output circuit of 3.

Figure 2:
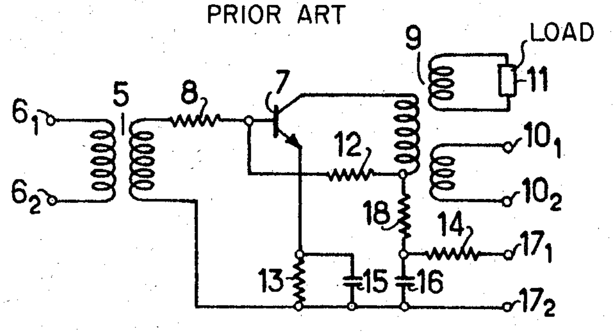
Fig.2 PRIOR ART
FIGURE 2 is an example of embodiment of the device shown in FIGURE 1.

An example of a converter-amplifier of this type is shown in greater detail in FIGURE 2. It comprises an input transformer 5, the primary winding of which is connected to the input terminals $6_1$ and $6_2$ across which the sine wave voltage is applied, the secondary winding being connected to the base electrode of a transistor 7 through a resistor 8 (this resistor serves to match the input impedance of the device to the impedance of the sine-wave source, which latter, not shown in the figure, is connected to the input terminals $6_1$ and $6_2$). The collector electrode of transistor 7 is connected to the primary winding of the output transformer 9, this transformer having a first secondary winding connected to the output terminals $10_1$ and $10_2$ across which the useful output signal appears and a further secondary winding closed on a non-linear impedance 11. The variation in the value of the latter impedance as a function of the applied voltage gives it a clipping action.

Resistors 8, 12, 13, 14 (by-passed by capacitors 15 and 16 for the high frequency currents) serve to bias the electrodes of transistor 7 from a direct-current source (not shown in the drawing) which is connected across terminals $17_1$ and $17_2$. A resistor 18 in series with the primary winding of the output transformer 9 is provided for the purpose of producing, in cooperation with resistor 12, series negative feedback so as to give the device a high output impedance, which will facilitate clipping, and also, with the aid of resistors 8 and 12, to give the input impedance of the device a well-defined value.

A rectangular-wave signal is obtained across the output terminals $10_1$ and $10_2$, as a result of the variation of the voltage gain of the amplifier as a function of the input level. This variation in gain stems from the reduction in the amplifier load impedance produced by the element 11 for increasing signal voltages, the latter impedance becoming lower as the voltage level of the input signal becomes higher.

The just-described converter has a very low efficiency since the non-linear impedance 11 dissipates most of the power as soon as the amplitude of the output signal reaches the clipping level. On another hand satisfactory operation of the converter can only be obtained if clipping actually takes place in the output clipping impedance and not as a result of saturation effects in the amplifier itself. Clipping taking place in the amplifier itself is accompanied by rectification effects and, consequently, results in a certain asymmetry in the respective durations of the positive and negative alterations of the output signal, the degree of such distortion being a function of the level of the signal applied to the converter input.

These effects could be compensated for by suitably controlling the initial bias conditions of the transistor. However, as the proper bias conditions depend on the supply voltages, such a method does not give the device a high degree of reliability.

Figure 3:
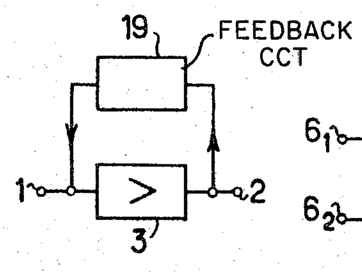
FIGURE 3 is a schematic illustration of a device of the type proposed in accordance with the invention.

The converter-amplifier in accordance with the invention and illustrated schematically in FIGURE 3, does not suffer from these drawbacks. It essentially includes an amplifier 3 and a non-linear negative feedback circuit 19. An embodiment of a converter of this kind is illustrated, by way of example, in FIGURE 4, where the elements of the amplifier common to FIGURES 2 and 4 have been given the same reference numbers. The converter includes input terminals $6_1$ and $6_2$, an input transformer 5, a matching resistor 8, a transistor 7, and an output transformer 20 with a single secondary winding is connected to the output terminals $10_1$ and $10_2$. Resistors 8, 12, 13 and 14, by-passed by capacitors 15 and 16, serve to bias the transistor 7 from a direct-current source, not shown in the drawing and connected across terminals $17_1$ and $17_2$.

Between the collector and base electrodes of transistor 7, a non-linear negative feedback circuit is connected.

Figure 4:
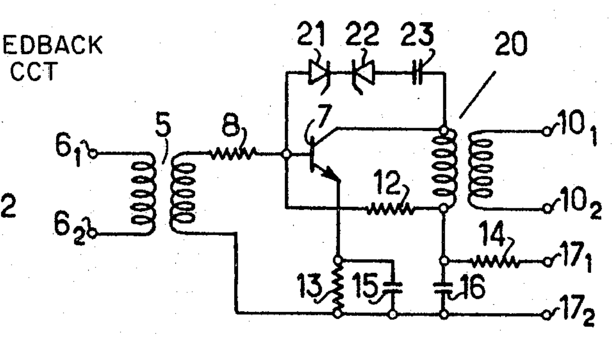
FIGURE 4 is an embodiment of a device in accordance with the invention.

A rectangular-wave signal appears across the output terminals $10_1$ and $10_2$ as a result of the variation in the "closed loop" voltage gain of the amplifier as a function of the input level. However, this gain variation does not arise from the same cause as in the case of FIGURE 2. In the case of FIGURE 4, it originates from the variation in the impedance of the negative feedback circuit linking the output and input circuits. This negative feedback impedance is that of a two-terminal network comprising two Zener diode assemblies 21 and 22 connected in series and in opposition, each assembly possibly including one or more series-connected diodes of low capacitance, and having the same breakdown direction. Each two assemblies is alternately effective for one of the half-cycles of the sinosoidal signal applied to the input of the device. To simplify the drawing, the symbol for a single Zener diode has been assumed to represent such a series assembly.

A capacitor 23 is connected in series with the two-terminal network constituted by the diode assemblies, to prevent direct-current flowing therethrough.

The wave shape of the signal appearing across terminals $10_1$ and $10_2$ (FIGURE 4) is the same as that of the signal fed in at the input terminals $6_1$ and $6_2$, as long as the applied input signal voltage remains lower than a critical value. Beyond this value however, the shape of the output signal depends on that of the current-voltage curve of the Zener diodes.

In order that limiting of the output signal amplitude should be governed by the limiting action of the negative feedback circuit and not by any clipping action due to saturation of the amplifier, the D.C. potential difference $V_{CE}$ applied between the emitter and collector electrodes must remain larger than the above-mentioned reference voltage $v$. In practice, it is convenient to make $V_{CE}$ approximately equal to 1.2 $v$, provided that 0.2 $v$ be higher than or equal to 2 volts.

The current intensity $i$ which the transistor must supply to the load impedance Z (as seen from the collector electrode), is given by the relationship: $i=v/Z$ As already explained, the direct biasing current intensity $I_c$ passing through the collector should be higher than that of the current $i$, in order that limiting of the output signal amplitude should result from the action of the negative feedback circuit and not from saturation of the amplifier. In practice, it is convenient to make $I_c$ about 1.2 times $i$, provided that 0.2 $i$ be equal to or higher than two milliamperes.

Further, in order that rectangular-wage signals may still be obtained at frequencies of several megacycles per second, it is essential that the Zener diodes should have low capacitance, to avoid any frequency-dependent effects in the negative feedback.

Figure 5:
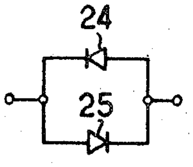
FIGURE 5 is an example of a two-terminal network other than that used in the invention, which may be employed in nonlinear negative feedback circuits.

The use of a two-terminal network such as that illustrated in FIGURE 5, comprising two oppositely oriented conventional diodes in parallel connection and whose working points are on the straight portions of their characteristics, would not allow performances as high as those of the device proposed in accordance with the invention to be obtained, since the static characteristics of such diodes are much less favorable than those of the Zener diodes. Again, due to variation of these characteristics with temperature, the signals obtained would be less stable in amplitude.

Figure 6:
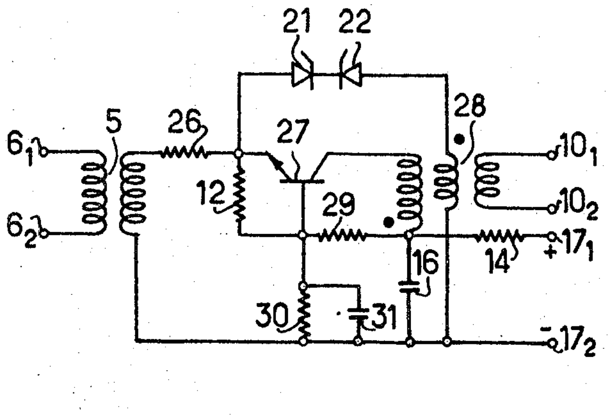
FIGURE 6 is another embodiment of a device somewhat similar to that proposed in accordance with the invention.

The invention is not limited to the use of the described grounded-emitter arrangement for the transistor, such as illustrated in FIGURE 4, it being equally possible to employ a grounded-base arrangement. A somewhat different device constructed according to a slightly different principle is illustrated in FIGURE 6. The secondary winding of the input transformer 5 is connected, via a matching impedance 26, to the emitter electrode of the grounded-base transistor 27.

The output transformer 28 has a primary winding, a secondary winding connected to the output terminals $10_1$ and $10_2$ and a further secondary winding, wound in the opposite direction to the primary, to which the negative feedback circuit embodying the two diode assemblies 21 and 22 is connected. Resistors 12, 14, 26, 29 and 30 and the by-pass capacitors 16 and 31 serve to bias the electrodes of transistor 27. However, experience shows that the device of FIG. 6 does not work very satisfactorily, owing to the absence of the series capacitor 23 of FIG. 4 and to the resulting direct-current bias on the Zener diodes.

In order to be able to employ Zener diodes with optimum characteristics, the breakdown voltage of which may differ widely from the collector-emitter supply voltage to the transistor, an output transformer may be used whose primary winding has one or two intermediate tappings. In this way, the minimum values for voltage $V_{CE}$ and current $I_c$ are determined taking into account the turns ratios of the windings or winding sections respectively inserted in the collector and negative feedback circuits.

Figure 7:
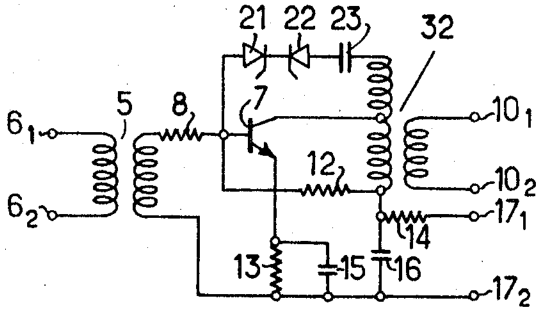
FIGURES 7 and 8 illustrate devices in accordance with the invention, provided with means which incorporate diode assemblies the reference voltage of which may be radically different from the direct-current voltage applied between the emitter and collector electrodes of the transistor.

In the device illustrated in FIGURE 7, the negative feedback circuit is connected to one end of the primary winding of the output transformer 32, this transformer having an intermediate tapping connected to the collector electrode of transistor 7. FIGURE 7 illustrates the case in which the normal operating voltage $v$ across each of the diode assemblies in the negative feedback circuit is much higher than the direct-current voltage $V_{CE}$ between the collector and emitter electrodes of 7. In contrast, in the converter of FIGURE 8, the negative feedback circuit is connected to the intermediate tapping on the primary winding of the transformer 33, one of whose ends is connected to the collector electrode of the transistor 7. This device is used in cases where $v$ is much lower than $V_{CE}$.

Figure 9:
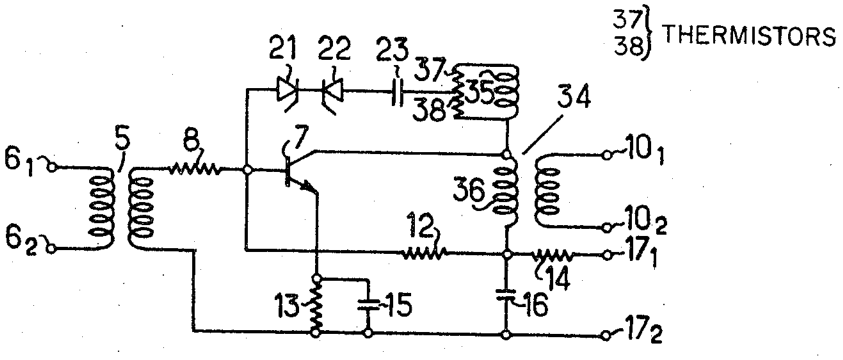
FIGURES 9 and 10 show devices in accordance with the invention, provided with means for controlling and compensating for variations which result from temperature effects.

FIGURE 9 shows a converter which derives from that illustrated in FIGURE 4. The output transformer 34 is provided with an additional winding 35 which is connected to the winding 36 leading to the collector of the transistor, the winding 35 having only a small number of turns in comparison with the winding 36. The winding 35 is linked to a voltage divider constituted by resistors 37 and 38 the junction point between which is connected to the negative feedback circuit formed by the elements 21, 22 and 23. This arrangement enables the output voltage to be controlled within close limits, by adjusting the values of resistors 37 and 38. In this instance, the breakdown voltage of the Zener diodes corresponds substantially to the characteristics obtaining in the arrangement of FIGURE 4.

Figure 8:
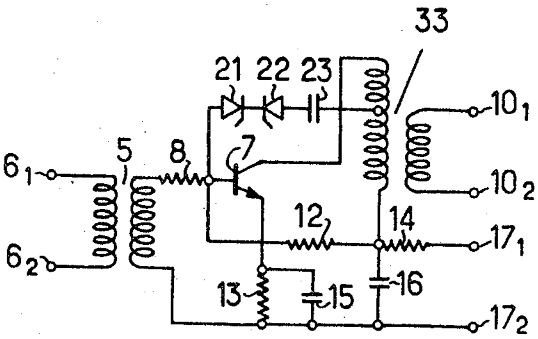

If the Zener diodes have breakdown voltages radically different from $V_{CE}$, they can be employed to obtain an output level which is controllable, by combining the arrangements indicated in FIGURES 7, 8 and 9.

It is also possible to modify the arrangement of FIGURE 9 to compensate for variations in the output voltage from the device, which might arise from various causes, in particular from the temperature coefficient of the diodes in the negative feedback circuit. All that is necessary is to provide one or two thermistors in association with the elements 37 and 38 of the voltage divider of FIGURE 9.

Figure 10:
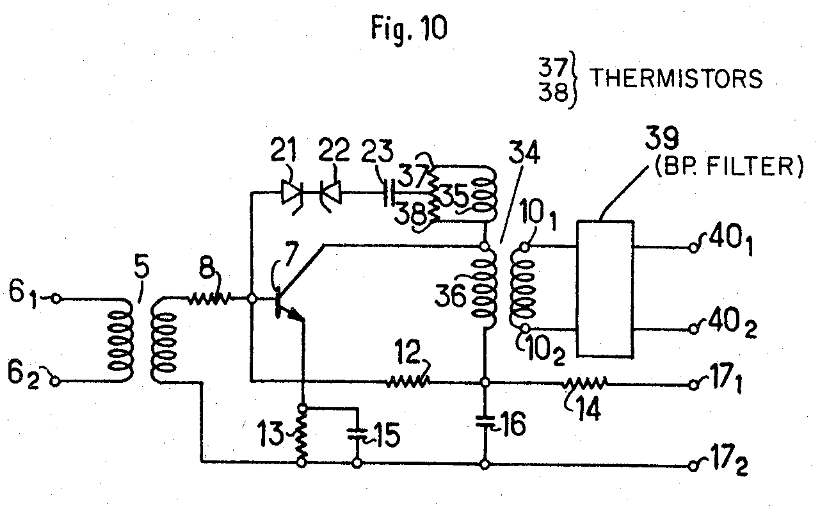

It may be that it is desired to obtain at the output of the converter not only rectangular-wave signals but also sinusoidal signals. In order to obtain the sinusoidal signals from the rectangular waves appearing at the terminals $\mathbf{10}_1$ and $\mathbf{10}_2$, a band-pass filter 39 may be inserted between the terminal pair $\mathbf{10}_1$, $\mathbf{10}_2$ and the terminal pair $\mathbf{40}_1$, $\mathbf{40}_2$ (FIGURE 10). The losses occurring in this filter are likely to vary as a function of temperature, and the correction necessary to ensure a constant signal level across the terminals $\mathbf{40}_1$ and $\mathbf{40}_2$ can be made using the same thermistor-type voltage divider arrangement mentioned with reference to FIGURE 9.

Although the Zener diodes used are assumed to have a very low capacitance, their capacitance is sufficiently high, when taken in conjunction with the collector-base capacitance of the transistor, to cause trouble at very high frequencies. The capacitive effects can, for example, prevent the attainment of a steep front edge where the production of rectangular waves is concerned. These difficulties can to some extent be overcome and compensated for by neutrodyning, i.e. by providing a capacitive element which is connected on the one hand to the input circuit and on the other to a circuit providing a voltage which is in phase opposition with that applied to the non-linear negative feedback circuit and which can be controlled in order to give the best possible compensation for the effects of the capacitances of the Zener diodes and the collector-base diode of the transistor.

Figure 11:
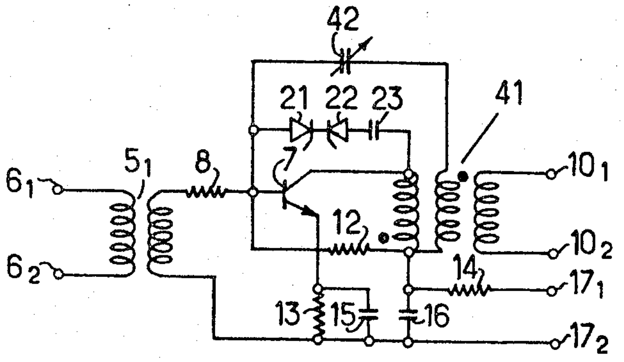
FIGURE 11 illustrates a converter-amplifier in accordance with the invention, specially adapted for operation at very high frequencies.

To this end, the device illustrated in FIGURE 11 can be used, this being provided with an output transformer 41 having a primary winding connected to the collector electrode, a first secondary winding connected to the terminals $\mathbf{10}_1$ and $\mathbf{10}_2$ and a further secondary winding, wound in the opposite sense to the primary winding. An adjustable capacitor 42 connects one end of the latter secondary winding with the transistor input circuit. The effect of the capacitance of 42 is opposite to that of the capacitance formed of the combined capacitances of the diodes and the collector-base interval of the transistor, and its value can be regulated to obtain the maximum degree of neutralization.

The improvements indicated in the devices of FIGURES 7, 8, 9, 10 and 11 have been described with reference to a grounded-emitter amplifier of the type illustrated in FIGURE 4 but could equally well be employed in the case of a grounded-base amplifier, such as is illustrated in FIGURE 6, the usual modifications being made.

The transistors used in the devices illustrated in the various figures, are of the n-p-n type, but if suitable modifications are made, it is of course also possible to employ p-n-p type transistors.

It will also be understood, of course, that the single amplifier stage hereinabove described may be preceded by other amplifier stages if the level of the input signals is too low, or followed by such other amplifier stages if it is desired to provide a higher output level.

What is claimed is:

1. A sinusoidal to rectangular wave converter comprising, in combination, a transistor amplifier having an input circuit and an output circuit, input connection means for applying a sinusoidal wave voltage to said input circuit, output connection means for applying output signals from said output circuit to a utilization circuit, and a non-linear negative feedback circuit connecting a first point taken in said output circuit to a second point taken in said input circuit and including a capacitor in series connection with two back-to-back series-connected identically poled Zener diodes.

2. A sinusoidal to rectangular wave converter comprising, in combination, a transistor amplifier having an input circuit and an output circuit, input connection means for applying a sinusoidal wave voltage to said input circuit, output connection means for applying output signals from said output circuit to a utilization circuit, and a non-linear negative feedback circuit connecting a first point taken in said output circuit to a second point taken in said input circuit and including a capacitor in series connection with two back-to-back series-connected identically poled Zener diodes, wherein said input and output connection means respectively include an input transformer and an output transformer, said first and second points being respectively taken in one winding of said output transformer and in one winding of said input transformer.

3. A sinusoidal to rectangular wave converter as claimed in claim 2, wherein said output transformer comprises a primary winding inserted in said output circuit of said transistor amplifier, and wherein said primary winding is provided with a tapping constituting said first point connected with said negative feedback circuit.

4. A sinusoidal to rectangular wave converter as claimed in claim 2, wherein said second secondary winding is connected with said negative feedback circuit through a voltage divider consisting of two series-connected resistors, said first point being the common point to said two resistors of said voltage divider.

5. A sinusoidal to rectangular wave converter as claimed in claim 4, wherein at least part of said resistors consists of thermistors.

6. A high frequency sinusoidal to rectangular wave converter comprising, in combination, a transistor amplifier having an input circuit and an output circuit, input connection means for applying a sinusoidal voltage to said input circuit, output connection means for applying output signals from said output circuit to a utilization circuit, and a non-linear feedback circuit connecting a first point taken in said output circuit to a second point taken in said input circuit, said feedback circuit comprising a capacitor in series connection with two back-to-back series connected identically poled Zener diodes, wherein said input and output connection means respectively include an input transformer and an output transformer, said output transformer being provided with a primary winding inserted in said output circuit of said transistor amplifier and with first and second secondary windings, the first of which is connected with said utilization circuit, wherein said first point is taken in said primary winding, and wherein said second point is connected with the second of said secondary windings through an adjustable capacitor.

7. A high frequency sinusoidal to rectangular wave converter as claimed in claim 6, wherein said transistor amplifier includes a single transistor having base, emitter and collector electrodes, and wherein said first and second points are respectively said base and collector electrodes.

References Cited by the Examiner

UNITED STATES PATENTS

| | | | |
|---|---|---|---|
| 3,058,068 | 10/1962 | Hinrichs et al. | 307—88.5 |
| 3,094,675 | 6/1963 | Ule | 307—88.5 |
| 3,153,152 | 10/1964 | Hoffman | 307—88.5 |
| 3,166,720 | 1/1965 | Rosen et al. | 307—88.5 |

ARTHUR GAUSS, *Primary Examiner.*

J. HEYMAN, *Assistant Examiner.*